United States Patent
Hosokawa

(10) Patent No.: US 6,920,593 B2
(45) Date of Patent: Jul. 19, 2005

(54) LOGICAL VERIFICATION APPARATUS AND METHOD FOR MEMORY CONTROL CIRCUIT

(75) Inventor: Hiroshi Hosokawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 455 days.

(21) Appl. No.: 10/124,365

(22) Filed: Apr. 18, 2002

(65) Prior Publication Data

US 2002/0157047 A1 Oct. 24, 2002

(30) Foreign Application Priority Data

Apr. 18, 2001 (JP) ........................................ 2001-119971

(51) Int. Cl.[7] .............................................. G11C 29/00
(52) U.S. Cl. ....................................................... 714/718
(58) Field of Search ................................ 714/718, 719, 714/720, 724, 42; 365/201

(56) References Cited

U.S. PATENT DOCUMENTS 6,501,690 B2 * 12/2002 Satoh ......................... 365/201

* cited by examiner

Primary Examiner—Guy J. Lamarre
Assistant Examiner—James C Kerveros
(74) Attorney, Agent, or Firm—Fitzpatrick, Cella, Harper & Scinto

(57) ABSTRACT

A CPU model issues a memory access request to a memory control circuit by executing a verification test program. A transaction monitor monitors a transaction generated on a system bus, and detects and holds a transaction of memory access from the CPU model. A memory model responds to access from the memory control circuit, and acquires transaction information of that access. A memory access checker logically verifies the memory control circuit using the transaction information acquired by the memory model, and the transaction information held by the transaction monitor.

15 Claims, 8 Drawing Sheets

FIG. 5

```
-Transaction Monitor
struct transact {                         501
    addr: unit;
    rd_wr: unit;
    data: unit;
    byteen: unit;
};

struct transaction_monitor {              502
    !trans_table: list of transact;
    !table_set: transact;
    event bclk is rise ('(sig_clk)');
    event bready is true ('(sig_ready_l)' ==0);
    on bready {                           503
        table_set.baddr = '(sig_baddr)';
        table_set.rd_wr = '(sig_wr_l)';
        table_set.byteen = '(sig_bbyteen_l)';
        table_set.bdata = '(sig_bdata)';
        trans_table.add(table_set);
    };

chk_table (addr:unit, rd_wr:unit, byteen:unit, data:unit) is {    504
        i = trans_table. first_index(.addr == addr);
        if (i != UNDEF) {
          dt = trans_table[i]. data;
          if (byteen != trans_table[i]. byteen) {out("ERROR on byteen");}
          else if (byteen[0:0] == 0 && (data[7:0] != dt[7:0])) {out("ERROR on byte0");}
          else if (byteen[1:1] == 0 && (data[15:8] != dt[15:8])) {out("ERROR on byte1");};
          else if (byteen[2:2] == 0 && (data[23:16] != dt[23:16])) {out("ERROR on byte2");}
          else if (byteen[3:3] == 0 && (data[31:24] != dt[31:24])) {out("ERROR on byte3");}
          else {trans_table. delete(i); out("VERIFIED!");};
        } else {
          out("ERROR: No transaction");
        };
    };
};
```

FIG. 6

```
--Memory Model
extend mem_model {                    601
    event mem_access is true('(mem_active)');
    on mem_access {                    602
        mem_addr = '(sig_mem_addr)';
        mem_rd_wr = '(sig_mem_wr_l)';
        mem_byteen = '(sig_mem_bbyteen_l)';
        mem_bdata = '(sig_mem_bdata)';
        transaction_monitor.chk_table(addr,rd_wr,byteen,data);    603
    };
};
```

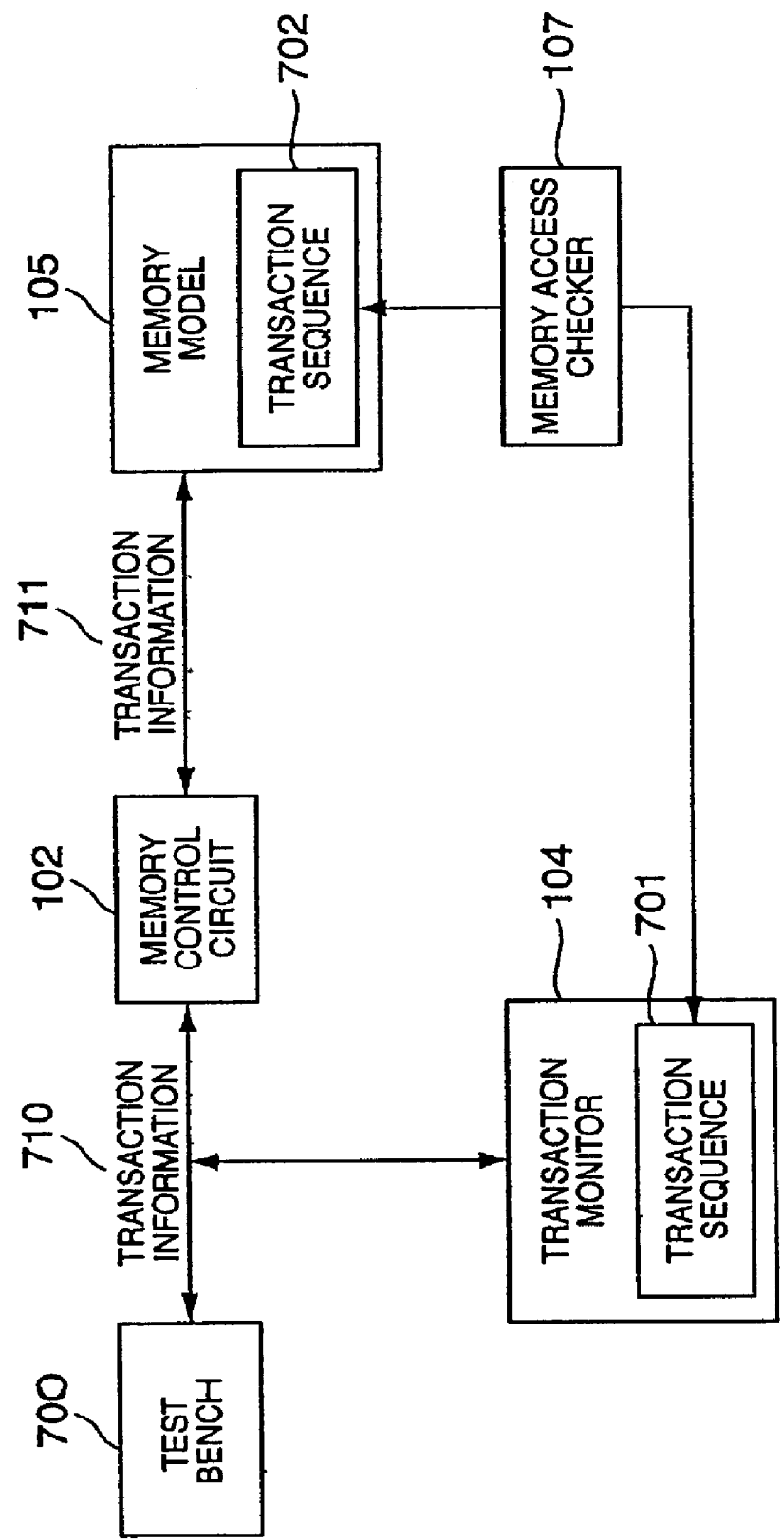

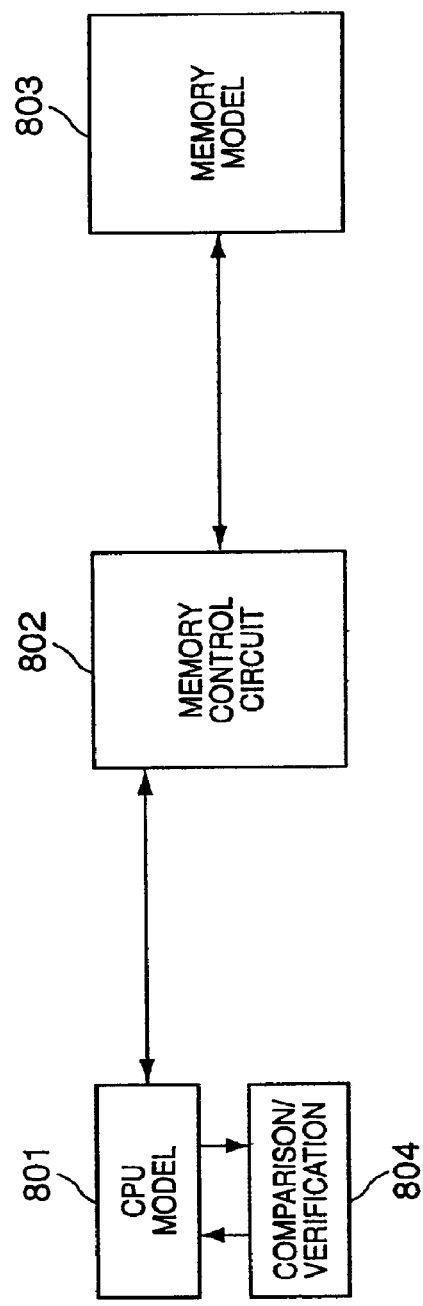
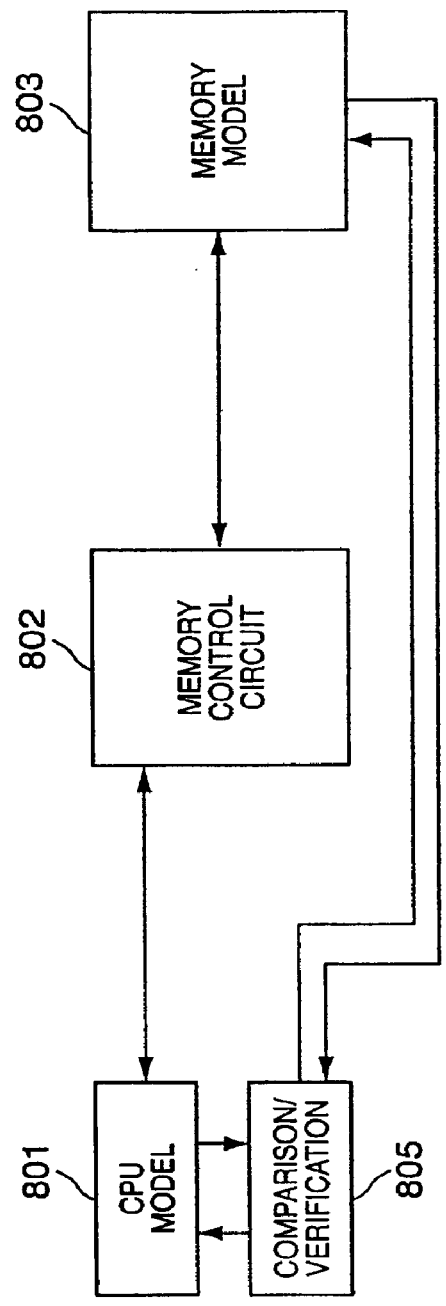
FIG. 8A
FIG. 8B

LOGICAL VERIFICATION APPARATUS AND METHOD FOR MEMORY CONTROL CIRCUIT

FIELD OF THE INVENTION

The present invention relates to a logical verification method and apparatus for a memory control circuit.

BACKGROUND OF THE INVENTION

A memory circuit, which is mounted on, e.g., a printer and comprises a plurality of memory chips, a hard disk, or the like has a memory control circuit for converting memory access (write or read access to the memory) generated by a CPU into access suitable for the memory circuit, and actually making access to the memory circuit. Such memory control circuit must undergo its logical verification in design since it makes logical arithmetic operations for converting access information such as addresses and the like. As the logical verification method for the memory control circuit, the following methods are known.

(1) As shown in FIG. 8A, a CPU model 801 executes a predetermined test program to write or read data to or from a memory model 803 via a memory control circuit 802. A comparison/verification unit 804 accesses the memory model 803 via the memory control circuit 802 on the basis of access information issued by the CPU model 801 to read out data, and makes verification by comparing the readout data with data written by the CPU model 801.

(2) As shown in FIG. 8B, the CPU model 801 executes a predetermined test program to write or read data to or from the memory model 803 via the memory control circuit 802. A comparison/verification unit 805 directly reads out data from an area of the memory model 803, where data is to be written, on the basis of access information issued by the CPU model 801, and makes verification by comparing the readout data with data written by the CPU model 801.

Likewise, the CPU model 801 reads out data from an area of the memory model 803, where data is to be written by a comparison/verification unit 805 directly, and makes verification by comparing the readout data with data written by the comparison/verification unit 805.

However, in the verification method (1), both the CPU model 801 and comparison/verification unit 804 access the memory model 803 via the identical memory control circuit 802. For this reason, even when data is written in or read out from an illegal area of the memory model 803 by access from the CPU model 801, data written by the CPU model 801 matches data read out by the comparison/verification unit 804, and such illegal read/write access cannot be verified.

According to the verification method (2), when data is written in or read out from only an illegal area of the memory model 803, such illegal access can be verified. However, when data is simultaneously written in both legal and illegal areas of the memory model 803, such access cannot be verified. This is because the comparison/verification unit 805 can only verify data in a legal area. Multiple accesses to a legal area cannot be verified, either. Note that multiple accesses are a bug that accesses a memory a plurality of times although access is required only once. In such multiple accesses, since read and write data remain the same, verification will succeed, but the memory performance deteriorates due to wasteful accesses.

That is, in the conventional verification methods, since a result written in the memory model 803 is merely read out and verified, a satisfactory verification result cannot be obtained, as described above. In either verification method (1) or (2), a series of operations such as write, read, and comparison with respect to the memory model 803 are required, resulting in poor verification efficiency.

SUMMARY OF THE INVENTION

The present invention has been made in consideration of the above problems, and has as its object to improve the accuracy and efficiency of logical verification associated with memory access of a memory control circuit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5 shows a program example of the transaction monitor of this embodiment;

FIG. 6 shows a program example of the memory access checker;

FIG. 7 is a block diagram showing the functional arrangement that implements a verification processing function in the memory control circuit verification apparatus of this embodiment; and FIGS. 8A and 8B are diagrams for explaining conventional logical verification methods of a memory control circuit.

DETAILED DESCRIPTION OF THE PREFERRED EMBODIMENTS

Preferred embodiments of the present invention will now be described in detail in accordance with the accompanying drawings.

Figure 1:
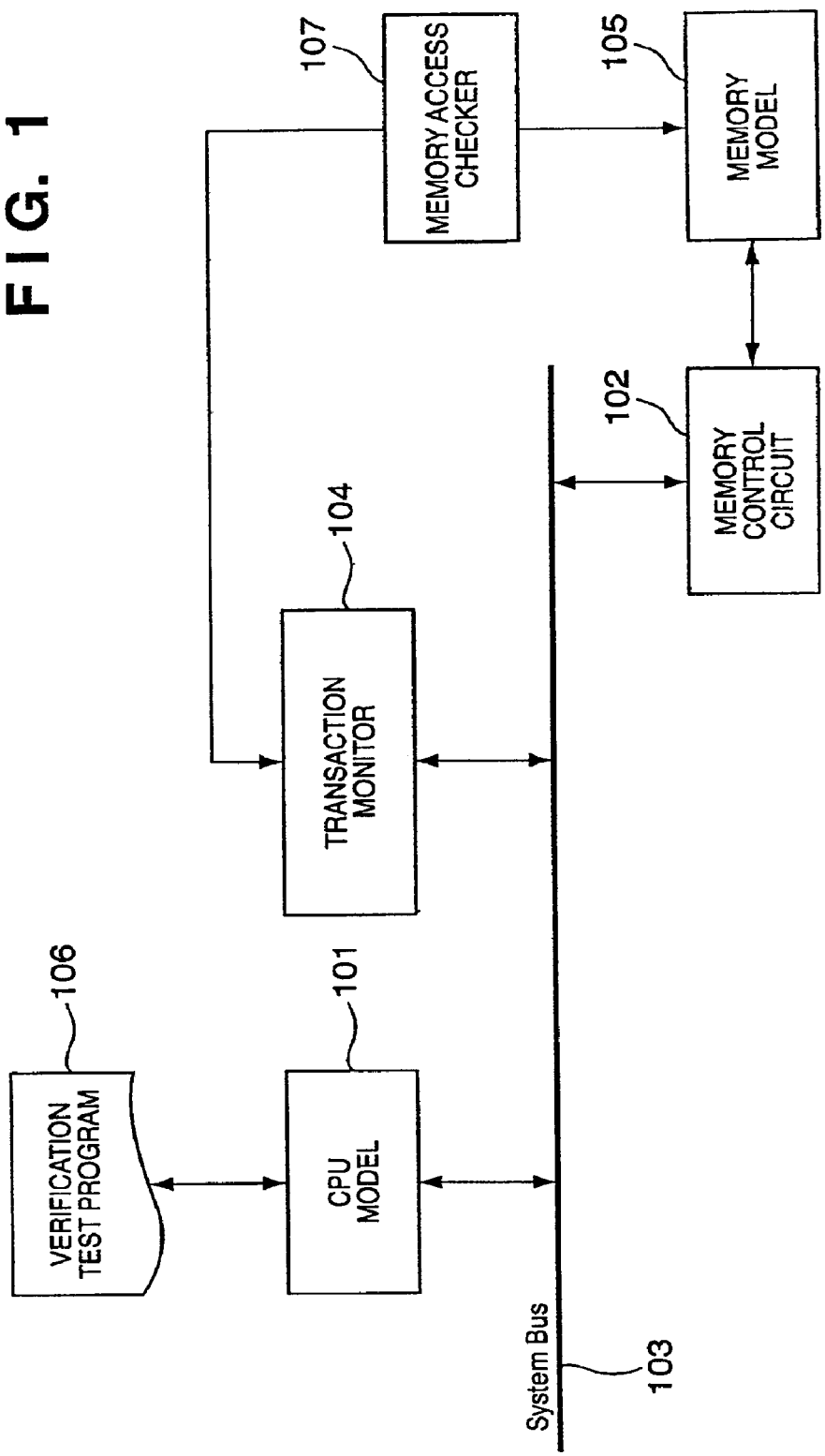
FIG. 1 is a block diagram for explaining the arrangement of a memory control circuit verification apparatus according to an embodiment of the present invention.

FIG. 1 is a block diagram for explaining the arrangement of a memory control circuit verification apparatus according to this embodiment. Referring to FIG. 1, reference numeral 101 denotes a virtual operation model of a central processing unit (to be referred to as a CPU model hereinafter); 102, a memory control circuit to be verified; 103, a system bus which connects the CPU model 101 and memory control circuit 102 by an electrical signal; 104, a transaction monitor for monitoring transactions on the system bus 103 and storing transaction information; and 105, a virtual operation model of a memory (to be referred to as a memory model hereinafter). The memory model 105 exchanges a required control signal and readout data with the memory control circuit 102 in accordance with memory access from the memory control circuit 102. Reference numeral 106 denotes a verification test program. The CPU model 101 executes this program to make read/write access to the memory control circuit 102. Reference numeral 107 denotes a memory access checker for making verification by comparing transaction information on the system bus and that of the memory model.

FIG. 7 is a block diagram showing the functional arrangement that implements a verification processing function in the memory control circuit verification apparatus of this embodiment. Reference numeral 700 denotes a test bench which includes the verification test program 106 and CPU model 101, and provides a logical verification environment of the memory control circuit. In the test bench 700, the verification test program 106 issues a memory read/write request to the CPU model 101. Upon receiving the memory read/write request from the verification test program 106, the CPU model 101 issues a memory read/write request to the memory control circuit 102 via the system bus 103.

In this specification, a write address and write data output upon writing data on a memory, and a read address output upon reading out data from the memory and readout data as that access result will be generally called transaction information. The transaction monitor 104 that monitors the system bus sequentially stores transaction information 710 between the memory control circuit 102 and CPU model 101 in a transaction sequence 701.

Upon receiving the transaction information 710, the memory control circuit 102 issues a read/write request to the memory model 105 to write and read out data to and from a memory address space requested by the transaction information. The memory model 105 returns a response corresponding to this read/write request to the memory control circuit 102. Also, the memory model 105 stores the transaction information 711 indicating this read/write request in a transaction sequence 702, and informs the memory access checker 107 of generation of access. At this time, the memory access checker 107 matches the memory address space and the address space on the system bus by, e.g., address conversion of the transaction information stored in the transaction sequence 702 in the memory model 105, and then confirms if that transaction information matches (or is equivalent to) the transaction information stored in the transaction sequence 701 of the transaction monitor 104.

As a result of comparison, if it is confirmed that the transaction information which is stored in the transaction sequence 702 and indicates access to the memory model 105 and its result matches the transaction information stored in the transaction sequence 701 in the transaction monitor 104, the memory access checker 107 deletes the transaction information from both the transaction sequence 701 and the transaction sequence 702 of the memory. On the other hand, if such confirmation has failed, an error is determined since this means that access different from that issued from the CPU model 101 to the memory control circuit 102 is generated in the memory model 105. Upon quitting the verification test program 106, if transaction information remains in the transaction sequence 701, since this means that an access request issued from the CPU model 101 to the memory control circuit 102 is not issued to the memory model 105, an error is determined. Likewise, upon quitting the verification test program 106, if transaction information remains in the transaction sequence 702 in the memory model 105, since this means that data is written in an illegal area simultaneously with a legal area, an error is also determined.

In this way, logical verification of the memory control circuit 102 is executed. The logical verification process of the memory control circuit according to this embodiment will be described in more detail below with reference to the flow charts in FIGS. 2 to 4.

Figure 2:
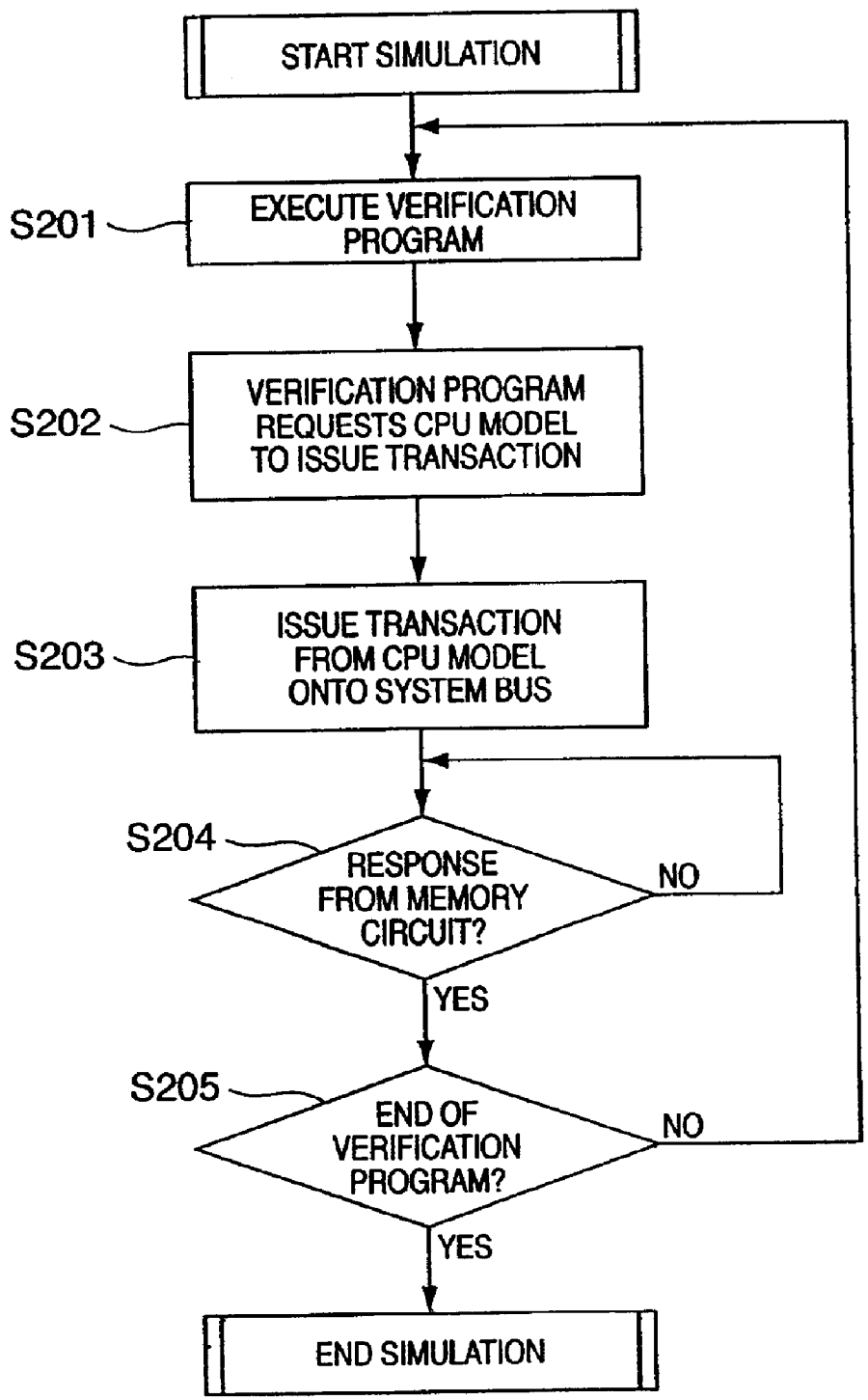
FIG. 2 is a flow chart showing an example of the operation algorithm of a verification test program and CPU model upon simulation.

FIG. 2 is a flow chart showing an example of the operation algorithm of the verification test program 106 and CPU model 101 upon simulation. If a simulation starts, the verification test program 106 is executed in step S201. The verification test program 106 includes a memory access request, and issues a memory access request to the CPU model 101 in step S202. The CPU model 101 then issues a transaction onto the system bus 103 in accordance with that access request in step S203.

The CPU model 101 waits for a response from the memory control circuit 102 in step S204. Upon receiving the response, the flow advances to step S205. If the verification test program 106 is not to quit, the flow returns to step S201, and the next request of the verification test program 106 is processed by the same method as described above. The aforementioned process is repeated until it is determined in step S205 that the verification test program is to quit.

Figure 3:
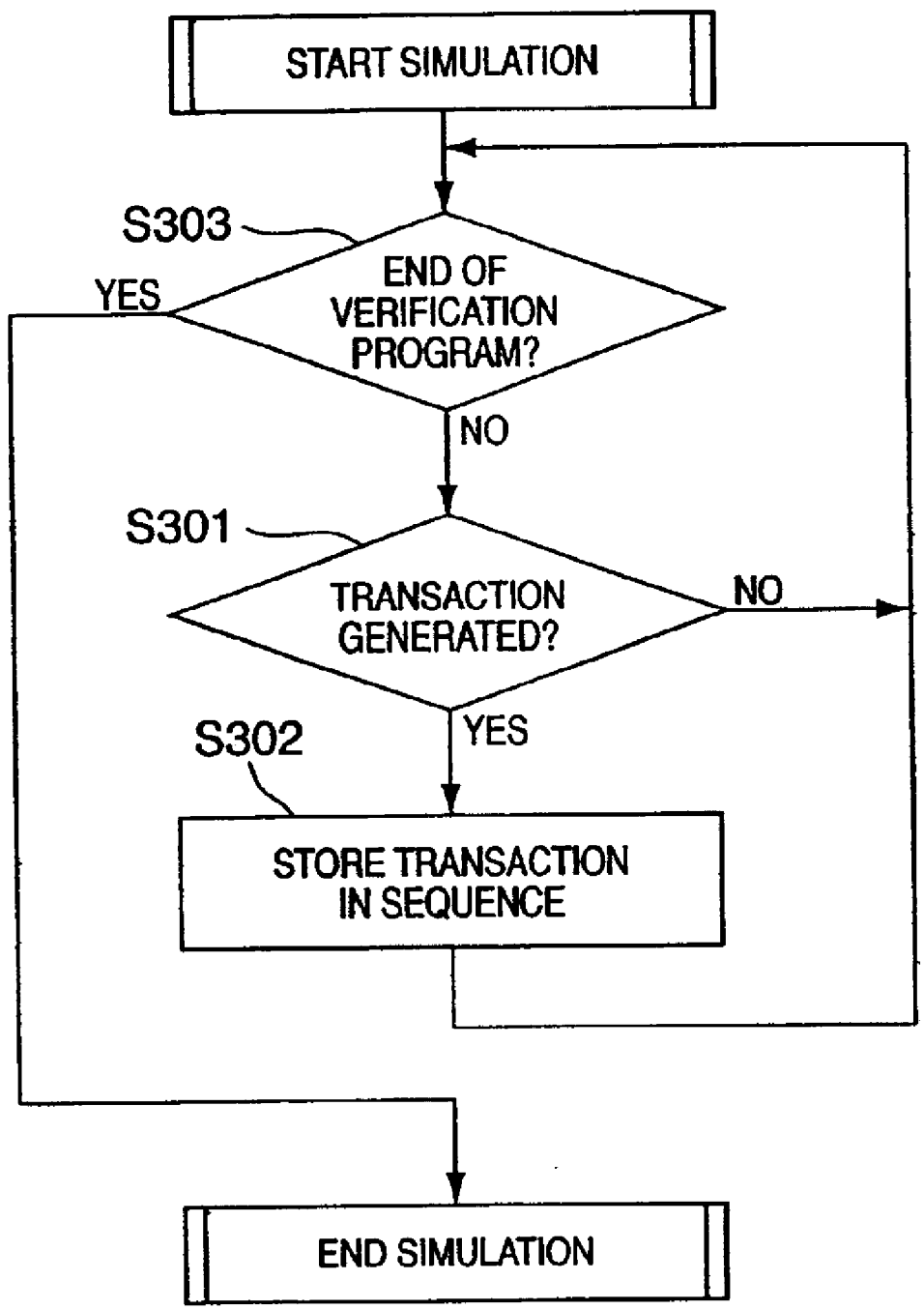
FIG. 3 is a flow chart showing an algorithm example in a transaction monitor according to this embodiment.

FIG. 3 is a flow chart showing an algorithm example in the transaction monitor 104 of this embodiment. The following process is repeated until it is determined in step S303 that the verification test program 106 is to quit.

It is monitored in step S301 if a transaction is generated on the system bus 103. If YES in step S301, the flow advances to step S302. In step S302, the transaction information (address, data, and the like) of the generated access is stored in the transaction sequence 701.

On the other hand, the memory model 105 stores transaction information 711 which is issued from the memory control circuit 102 to the memory model 105 in the transaction sequence 702. The storage process of transaction information in the transaction sequence in the memory model 105 is the same as the process (FIG. 3) in the transaction monitor 104. That is, the memory model 105 stores memory read/write access in the transaction sequence 702 in place of actual memory read/write access in response to a transaction issued by the memory control circuit 102.

Figure 4:
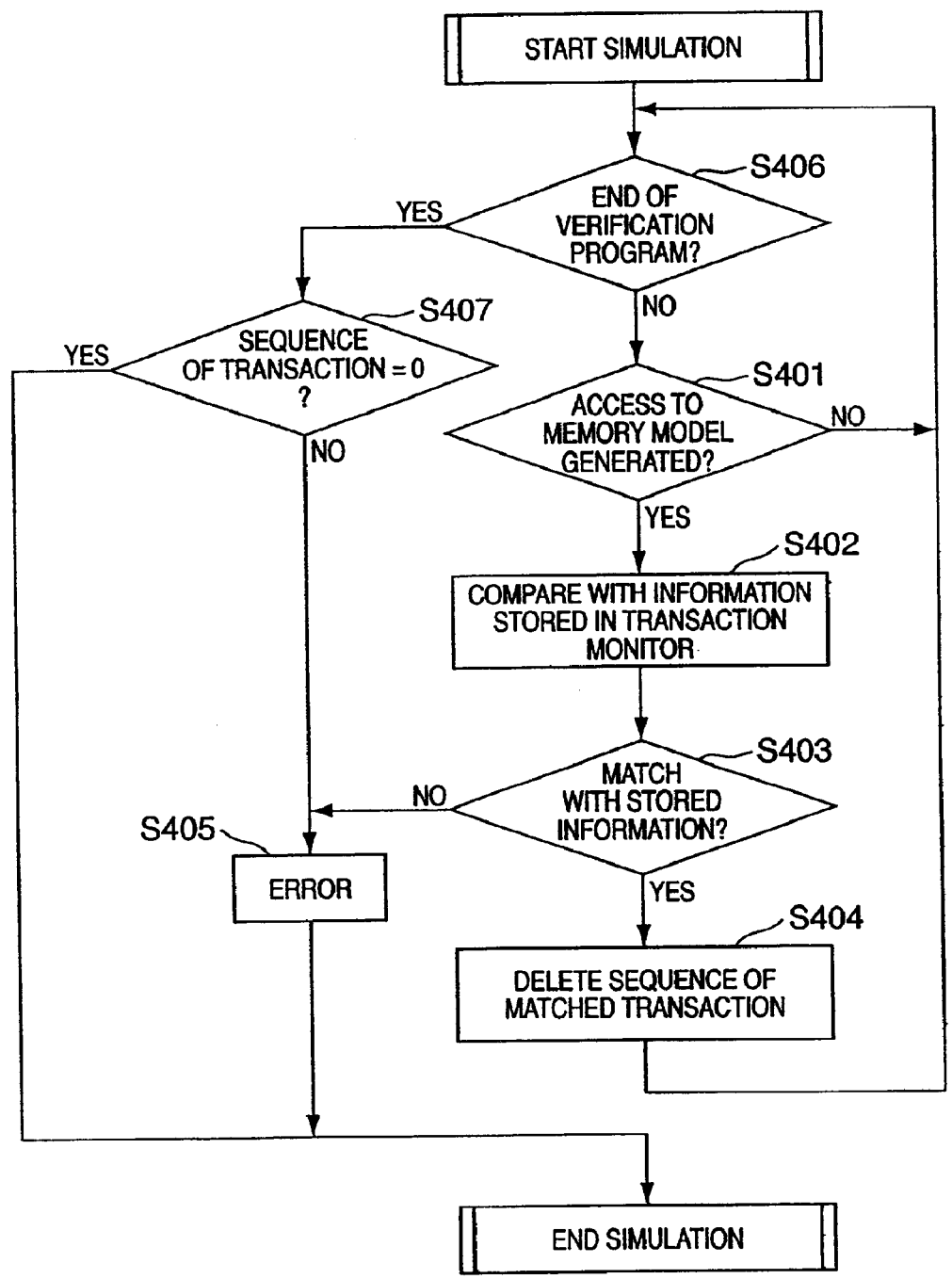
FIG. 4 is a flow chart showing an algorithm example of a memory access checker according to this embodiment.

FIG. 4 is a flow chart showing an algorithm example of the memory access checker 107 of this embodiment. Steps S401 to S404 are repeated until it is determined in step S406 that the verification test program is to quit or until any error is detected.

In step S401, the memory access checker 107 waits for an access generation message from the memory model 105. Upon generation of access, the flow advances to step S402, and the memory access checker 107 compares the access contents to the memory model 105 (transaction information in the transaction sequence 702) with transaction information stored in the transaction sequence 701 of the transaction monitor 104 (in step S302). As a result of comparison in step S402, if the access contents match, the flow advances to step S404, and the memory access checker 107 deletes that transaction information from the transaction sequence 701 stored in the transaction monitor 104 and the transaction sequence 702 stored in the memory model 105.

On the other hand, if mismatch is found as a result of comparison in step S402, the flow advances from step S403 to step S405 to execute an error process, thus ending this simulation.

If the verification test program quits, the flow advances from step S406 to step S407 to confirm if the transaction sequence 701 stored in the transaction monitor 104 and the transaction sequence 702 stored in the memory model 105 are empty. If the transaction sequence 701 is not empty, since the issued transaction is not reflected as access to the memory model 105, an error process is executed in step S405. On the other hand, if the transaction sequence 702 is not empty, since data is written in an illegal area simultaneously with a legal area, an error process is executed in step S405. If the transaction sequence 701 stored in the transaction monitor 104 is empty, it is determined that access is normally made, and the simulation ends.

FIG. 5 shows a program example of the transaction monitor 104 of this embodiment.

Reference numeral 501 denotes a structure that stores a transaction, i.e., a field that defines the transaction sequence 701. This structure is made up of address read or write byte lane data. In this example, the system bus is assumed to have a 32-bit width, and mask information for each 8-bit byte data is indicated by a byte lane. Reference numeral 502 denotes a field for monitoring a transaction by the transaction monitor 104 (step S301). Upon detection of a transaction generated on the system bus, a field 503 adds transaction information of that transaction to the transaction information sequence (step S302).

Reference numeral 504 denotes a program for comparing a specific transaction with the stored transaction sequence. If that specific transaction is not found from the stored sequence, an error is determined. If a transaction which matches the specific transaction is found, that sequence is deleted. This process corresponds to steps S402 to S405 in FIG. 4, and the memory model 105 executes the process of this field (504), as will be described later using FIG. 6.

FIG. 6 shows a program example of the memory access checker 107. Reference numeral 601 denotes a function extension of the memory model. In a field 602, the control waits for an access event to the memory model, and upon detection of an access event, it is compared with a transaction sequence stored in the transaction monitor in a field 603 on the basis of information of address read or write byte lane data of the accessed memory. In the field 603, the field 504 in FIG. 5 is launched using transaction information to the memory model as an argument.

As described above, in this embodiment, the transaction monitor 104 monitors a transaction on the system bus 103 to which the memory control circuit 102 is connected, and stores the generated transaction in the transaction sequence 701. The memory model 105 for logical verification, which can operate in the same manner as a real memory, has the transaction sequence 702. Upon generation of access to the memory model 105, the memory access checker 107 makes verification by comparing a transaction stored in the transaction sequence 702 in the memory model 105 with a transaction stored in the transaction sequence 701 in the transaction monitor 104. If the two transactions match, the memory access checker 107 deletes these transactions from the transaction sequences 701 and 702. If the two transactions do not match in this comparison/verification, or if transaction information remains in the transaction sequences 701 and 702 upon quitting the verification test program, an error is determined.

With the above arrangement, the following effects are obtained.

1. Since a transaction between the memory control circuit 102 and CPU model 101, and that between the memory control circuit 102 and memory model 105 are compared, verification accuracy can be improved. That is, a. data read/write access to an illegal area of the memory model can be verified;

b. data write access to an illegal area simultaneously with that to a legal area can be verified; and c. multiple accesses to a legal area can be verified, since generation of access to a memory, which is not generated in practice in a transaction, can be detected.

2. Since the transaction monitor and memory model execute comparison/verification of a transaction to the memory area, the verification test program need only read or write data to all memory areas, thus simplifying the verification test program, and improving the verification efficiency.

3. If the memory model corresponds to a memory transaction, the function of the memory checker can be commonly used irrespective of the type of memory, thus improving the verification efficiency.

As described above, according to the present invention, the accuracy and efficiency of logical verification associated with memory access of the memory control circuit can be improved.

As many apparently widely different embodiments of the present invention can be made without departing from the spirit and scope thereof, it is to be understood that the invention is not limited to the specific embodiments thereof except as defined in the claims.

What is claimed is:

1. An apparatus for logically verifying a memory control circuit, comprising:

a request unit for issuing a memory access request to the memory control circuit in accordance with a predetermined test program;

a first holding unit for holding a transaction issued from said request unit to the memory control circuit;

a second holding unit for holding a transaction issued from the memory control circuit to a memory to be accessed in response to the transaction;

a comparison unit for comparing the transactions held in said first and second holding units every time a transaction is issued to the memory control circuit;

a deletion unit for deleting the transactions from said first and second holding units when it is determined as a result of comparison that the two transactions are equivalent to each other; and a verification unit for outputting a verification error when the transaction remains in at least one of said first and second holding units after the test program quits.

2. The apparatus according to claim 1, wherein said verification unit outputs a verification error when it is determined as a result of comparison that the two transactions are not equivalent to each other.

3. The apparatus according to claim 1, wherein said request unit includes a CPU model for executing a verification test program, and said first holding unit detects and holds a transaction which is issued by the CPU model onto a bus.

4. The apparatus according to claim 1, wherein said second holding unit has a function of a virtual operation memory which operates as the memory to be accessed.

5. A method of logically verifying a memory control circuit, comprising:

the request step of issuing a memory access request to the memory control circuit in accordance with a predetermined test program;

the first holding step of holding, in a first holding unit, a transaction issued in the request step to the memory control circuit in accordance with a predetermined test program;

the second holding step of holding, in a second holding unit, a transaction issued from the memory control circuit to a memory to be accessed in response to the transaction;

the comparison step of comparing the transactions held in said first and second holding units every time a transaction is issued to the memory control circuit;

the deletion step of deleting the transactions from said first and second holding units when it is determined as a result of comparison that the two transactions are equivalent to each other; and the verification step of outputting a verification error when the transaction remains in at least one of the first and second holding units after the test program quits.

6. The method according to claim 5, wherein the verification step includes the step of outputting a verification error when it is determined as a result of comparison that the two transactions are not equivalent to each other.

7. The method according to claim 5, wherein the request step includes the step of executing a verification test program using a CPU model, and the first holding step includes the step of detecting a transaction which is issued by the CPU model onto a bus, and holding the detected transaction in the first holding unit.

8. An apparatus for logically verifying a memory control circuit, comprising:

request means for issuing a memory access request to the memory control circuit;

a memory model which runs in accordance with access executed by the memory control circuit;

holding means for monitoring a signal on a bus which connects said request means and the memory control circuit, and holding transaction information based on a transaction generated between said request means and the memory control circuit in response to the access request issued by said request means;

acquisition means for acquiring transaction information based on a transaction generated between the memory control circuit and said memory model when the memory control circuit accesses said memory model in accordance with the request;

deletion means for deleting transaction information when the transaction information corresponding to the transaction information acquired by said acquisition means is present in said holding means; and verification means for determining that logical verification has failed when transaction information finally remains in said holding means.

9. The apparatus according to claim 8, wherein the transaction information contains a memory space of an access destination, and contents thereof.

10. The apparatus according to claim 8, wherein said request means includes a verification test program used to write and read out data to and from said memory model, and a CPU model for executing the verification test program.

11. The apparatus according to claim 8, wherein said verification means determines that logical verification has failed when transaction information corresponding to the transaction information acquired by said acquisition means is not present in said holding means.

12. A method of logically verifying a memory control circuit by accessing a memory model via the memory control circuit, comprising:

the request step of issuing a memory access request from a request unit to the memory control circuit;

the holding step of monitoring a signal on a bus which connects said request means and the memory control circuit, and holding transaction information in a holding unit based on a transaction generated between the request unit and the memory control circuit in response to the access request issued in the request step;

the acquisition step of acquiring transaction information based on a transaction generated between the memory control circuit and the memory model when the memory control circuit accesses the memory model in accordance with the request;

the deletion step of deleting transaction information when the transaction information corresponding to the transaction information acquired in said acquisition step is present in the holding unit; and the verification step of determining that logical verification has failed when transaction information finally remains in the holding unit.

13. The method according to claim 12, wherein the transaction information contains a memory space of an access destination, and contents thereof.

14. The method according to claim 12, wherein the request step includes the step of making a CPU model execute a verification test program used to write and read out data to and from the memory model.

15. The method according to claim 12, wherein the verification step includes the step of determining that logical verification has failed when transaction information held in the holding step and corresponding to the transaction information acquired in the acquisition step is not present in the holding unit.

* * * * *